United States Patent [19]

Otsuki et al.

[11] Patent Number: 5,378,903
[45] Date of Patent: Jan. 3, 1995

[54] SEMICONDUCTOR DEVICE WITH LOW ON-VOLTAGE AND LARGE CONTROLLABLE TURN-OFF CURRENT

[75] Inventors: Masahito Otsuki; Katsunori Ueno, both of Matsumoto, Japan

[73] Assignee: Fuji Electric Co., Ltd., Kawasaki, Japan

[21] Appl. No.: 215,777

[22] Filed: Mar. 22, 1994

[30] Foreign Application Priority Data

Mar. 23, 1993 [JP] Japan .................. 5-062280
Jul. 16, 1993 [JP] Japan .................. 5-175779

[51] Int. Cl.⁶ ............... H01L 29/74; H01L 27/02
[52] U.S. Cl. ..................... 257/133; 257/132; 257/137; 257/146; 257/155; 257/163; 257/167; 257/172
[58] Field of Search ............ 257/132, 133, 137, 146, 257/155, 163, 167, 172

[56] References Cited

U.S. PATENT DOCUMENTS 4,604,638 8/1986 Matsuda .................. 257/167
5,319,221 6/1993 Ueno .................... 257/133

OTHER PUBLICATIONS

Seiji Momota et al., Double gata MOS device Having IGBT and MCT performances.
M. Nandakumar et al., Fast switching power MOS–gated (EST and BRT) thyristors.

Primary Examiner—Ngan V. Ngo
Attorney, Agent, or Firm—Kanesaka & Takeuchi

[57] ABSTRACT

The semiconductor device is formed of an EST part and an IGBT part, wherein the EST part has a first MOSFET and a second MOSFET synchronously switching, and the IGBT part has a third MOSFET controllable independently from them. At a turn-off of the semiconductor device, when turning off the first and second MOSFETs while keeping the third MOSFET at an on-state, IGBT operation remains. Thus, the current path which tends to flow to an emitter region changes toward an emitter electrode side even if the recovery of the potential barrier is late due to the junction in the emitter region, and the charge accumulation to the emitter region is restrained. After the potential barrier is recovered, the third MOSFET is turned off. Controllable turn-off current can be enlarged and turn-off time can be shortened.

8 Claims, 6 Drawing Sheets

SEMICONDUCTOR DEVICE WITH LOW ON-VOLTAGE AND LARGE CONTROLLABLE TURN-OFF CURRENT

BACKGROUND OF THE INVENTION AND RELATED ART STATEMENT

The invention relates to a semiconductor device of pnpn structure used for power devices and so on, and more particularly a semiconductor device of double gate type with two gate electrodes.

One of the most important key technologies to solve problems, such as high performance, miniaturization and low-cost in power electronics, is to lower the loss of power devices, and the development of devices with low on-state voltage and short turn-off time is actively developing in many fields. For instance, bipolar transistors with high performance, high voltage and large current have been achieved, and intelligent modules containing therein various protection functions have been made. Moreover, IGBT (conductivity modulation transistor, insulated gate bipolar transistor) of high-speed response has been made.

These power devices are applied to miniaturized electrical apparatus to which electricity is supplied from a battery to be able to easily carry, inverters, electric vehicles which are being examined from the view point of environmental protection, etc. and bear the role of electric power conservation. And, in order to respond to demand for electric power increasing more and more in recent years, the power conservation and low loss in power devices are further required to these power semiconductor devices.

For instance, EST (emitter switched thyristor) to reduce on-state voltage by thyristor structure and to make high speed and low driving power by MOS gate device has been developed. This EST is a device which has a structure and an equivalent circuit shown in FIGS. 8 and 9.

This EST comprises a collector layer 2 of a p+ type semiconductor substrate (anode layer of a thyristor) with which a collector electrode 1 (anode electrode of the thyristor) is formed; an n+ type buffer layer 3 formed on the collector layer 2; an n− type base layer 4 (drift layer) formed on the buffer layer 3; a p type base region 5 in the form of well and being formed in the main face side of the n− type base layer 4; an n+ type emitter region 6 (cathode region of the thyristor) formed in the main face side of the p type base region 5; an n+ type source region 7 formed in the main face side of the p type base region 5 and isolated from the p+ type emitter region 6; an emitter electrode 8 (cathode electrode of the thyristor) which conductively contacts both main face of the p type base region 5 and the n+ type source region 7; a first gate electrode 9 which uses the p type base region 5 as a back gate (channel region) and is formed to cover the n+ type emitter region 6 and the n− type base layer 4 through a gate insulation film 9a; and a second gate electrode 11 which uses the p type base region 5 as a back gate (channel region) and is formed to cover the n+ type source region 7 and the n+ type emitter region 6 through a gate insulation film 10, the second gate electrode conductively contacting the first electrode 9.

The first gate electrode 9, the emitter region 6, a channel part M1 in the p type base region 5 and the n−type base layer 4 form a first MOSFET 12 for ON. The second gate electrode 11, the n+ type source region 7, a channel part M2 in the p type base region 5 and the emitter region 6 form a second MOSFET 13 (emitter switch) for short-circuit. The first MOSFET 12 and the second MOSFET 13 are insulated gate field effect transistors of n channel type.

Moreover, the p+ type collector layer 2, the n+ type buffer layer 3, the n− type base layer 4 and the p type base region 5 form a pnp type bipolar transistor $Q_{pnp}$. The n− type base layer 4, the p type base region 5 and the n+ type emitter region 6 form an npn type bipolar transistor $Q_{npn}$. Besides, a base resistance $R_B$ (diffused resistor) exists as a short circuit resistance because the emitter electrode 8 contacts the p type base region 5. The above-mentioned semiconductor structures are symmetric with respect to the axis at the center of the emitter electrode 8, and the structure shown in FIG. 8 shows only the right half of the device.

When a high voltage is applied to the gate electrodes 9, 11, at first, the MOSFETs 12 and 13 conduct, so that majority carriers (electrons) are injected into the n− type base layer 4 through the emitter electrode 8, the source region 7, the channel part M2, the emitter region 6 and the channel part M1. At the same time, minority carriers (holes) flow into the n− type base layer 4 through the collector electrode 1, the collector region 2 and the buffer layer 3, so that the conductivity of the n− type base layer 4 is modulated. Since the transistor $Q_{pnp}$ is turned ON with this, the transistor $Q_{npn}$ is turned on, and the thyristor pnpn turns on.

As shown in FIG. 10(a), in the on-state of this thyristor, an electron current (solid line arrow) flows through the channel part M1, and simultaneously the hole current (dashed line arrow) and electron current flow through the junction of the n+ type base region 5 and the p type emitter region 6, wherein the junction between the base region 5 and the emitter region 6 is forward biased.

Next, when zero or negative voltage is applied to the gate electrodes 9, 11, the MOSFETs 12 and 13 are cut off, and the injecting of the majority carriers to the n− type base layer 4 stops and the conduction between the emitter region 6 and the source region 7 is cut off. Therefore, the transistor $Q_{npn}$ becomes off-state, so that the transistor $Q_{pnp}$ turns off and the thyristor pnpn is also turned off. The n+ type buffer layer 3 is formed to shorten the turn off time by restraining the injecting efficiency of the holes (minority carriers) from the collector layer 2 to the base layer 4 of n− type.

When the thyristor operates, a current flows from the n− type base layer 4 into the n+ type emitter region 6 through the p type base region 5, wherein the p-n junction of the p type base region 5 and the n+ type emitter region 6 is in the state of forward bias and the electric potential barrier of the p-n junction is lost. Thus, as shown in FIG. 10(b), if the conduction between the emitter region 6 and the source region 7 is cut off by turning off the MOSFET 13 at the initial stage of the turn-off operation, the p-n junction of the p type base region 5 and the n+ type emitter region 6 is in the state of forward bias due to a voltage drop across a short circuit resistance $R_B$. This potential barrier does not recover easily, wherein the holes flow for a while through the junction and accumulate into the emitter region 6.

To shorten the turn-off time due to the recovery lag of the potential barrier according to the p-n junction of the p type base region 5 and the n+ type emitter region 6 at the turn-off of the thyristor, the second MOSFET 13 for short circuit switches off between the source region 7 and the emitter region 6, that is, internally disconnects between the emitter region 6 as a substantial cathode region and the emitter electrode 8 as a substantial cathode electrode. In the turn off operation, since the secondary current flowing through the base resistance $R_B$ remains only at the first stage, the turn-off time can be shortened.

However, since a coupling capacity $C_{gd}$ is parasited (parasitic capacity) between the gate electrode 11 and the emitter region 6 as a drain region of the second MOSFET 13, if the recovery of the potential barrier due to the p-n junction of the p type base region 5 and the n+ type emitter region 6 is late, the voltage rises since the positive holes accumulate in the n+ type emitter region 6, and in response to this, the gate potential rises. Thus, breakdown of the gate insulation film 10 and repetition of ON of the MOSFET 13 happen easily. Therefore, though it is necessary to reduce the current flowing into the n+ type emitter region 6 at turn off, if the current is reduced, it comes to reduction of controllable turn-off current and prolongation of the turn-off time, so that there is a limit as a power device. On the other hand, it may be considered to raise breakdown voltage by thickening the gate insulation film 10, but the on-state voltage rises.

Thus, the present invention has been made with reference to the above problems, and the object of the present invention is to provide a semiconductor device which has a low on-voltage and can obtain a large controllable turn-off current by restraining the current flow into the emitter region by changing current path by IGBT operation once at turn-off.

SUMMARY OF THE INVENTION

To resolve the above-mentioned problems, the present invention uses a hybrid structure of EST and IGBT, and includes a third MOSFET independently switchable to change the current path at turn-off.

The semiconductor device of the invention comprises a thyristor structure which comprises a first semiconductor region of the first conduction type, a second semiconductor region of the second conduction type, a third semiconductor region of the first conduction type, and a fourth semiconductor region of the second conduction type formed in a main face side of the third semiconductor region; a fifth semiconductor region of the second conduction type formed in a part of the main face side of the third semiconductor region, which is isolated and independent from the fourth semiconductor region; a first MOSFET which uses the third semiconductor region as a back gate and can inject majority carriers from the fourth semiconductor region into the second semiconductor region; a second MOSFET which is switched to synchronize the first MOSFET, uses the third semiconductor region as a back gate (channel region), and can conduct and cut off between the fourth semiconductor region and the fifth semiconductor region; and an electrode which conductively contacts the third semiconductor region and the fifth semiconductor region.

In the invention, the semiconductor device further includes a sixth semiconductor region of the second conduction type, which is formed in the main face side of the third semiconductor region to be isolated from the fifth semiconductor region and conductively contacts the electrode; and a third MOSFET which uses the third semiconductor region as a back gate (channel region), can inject majority carriers from the sixth semiconductor region into the second semiconductor region and can switch independently from the first MOSFET.

It is desirable to have a structure such that in the third semiconductor region of the first conductive type, a highly doped semiconductor region of the first conduction type is formed at least near the junctions of the third semiconductor region relative to the fifth semiconductor region and the sixth semiconductor region of the second conduction type. The above-mentioned highly doped semiconductor region of the first conduction type may, actually, be a well region, in which the depth is nearly equal to or deeper than that of the third semiconductor region of the first conduction type, or may be shallower than that of the semiconductor region of the first conduction type. Further, the deep region and the shallow region may be combined together.

This semiconductor device operates as in the conventional EST when it is turned on. That is, when the first, second and third MOSFET are turned on, majority carriers are poured into the second semiconductor region through the electrode, the fifth semiconductor region, a channel part of the second MOSFET, the fourth semiconductor region and a channel part of the first MOSFET, and also, the majority carriers are injected into the second semiconductor region through the above-mentioned electrode, the sixth semiconductor region and a channel part of the third MOSFET.

As a result, a bipolar transistor of the second conduction type formed of the first semiconductor region of the first conduction type, the second semiconductor region of the second conduction type and the third semiconductor region of the first conduction type becomes on-state, so that a bipolar transistor of the first conduction type formed of the second semiconductor region of the second conduction type, the third semiconductor region of the first conduction type and the fourth semiconductor region of the second conduction type becomes on-state to thereby turn on a thyristor of pnpn structure.

In these on-states, the majority carriers are flowing through the first and third MOSFETs, and the current (majority carriers and minority carriers) is flowing through a p-n junction of the third semiconductor region and the fourth semiconductor region, so that the potential barrier according to this junction has disappeared.

Next, at the turn-off operation, when the first and second MOSFETs are turned off while keeping the third MOSFET at the on-state, the current continues to flow through the third MOSFET and only the IGBT operation remains. Thus, the direction of the current path of the majority carriers in the third semiconductor region which flow through the p-n junction of the third semiconductor region and the fourth semiconductor region changes, and the carriers flow toward the above-mentioned electrode. Therefore, it is possible to restrain charge accumulation in the fourth semiconductor region in association with cut-off of the first and second MOSFETs, so that breakdown of the gate insulation film and the repetition of ON of the second MOSFET can be prevented. Thus, the controllable turn off current can be enlarged under a low on-state voltage without thickening the insulation film. In other words, it is possible to shorten the turn-off time because turn off operation of the second MOSFET can be securely made.

In the third semiconductor region of the first conduction type, in case highly doped semiconductor region of the first conduction type is formed at least near the junctions of this region to the fifth semiconductor region of the second conduction type and the sixth semiconductor region of the second conduction type, the voltage drop across the short circuit resistance does not rise, even if the current increased at turn off flows near the junction, because the parasitic resistance (short circuit resistance) near the junction is made low. Therefore, the parasitic bipolar transistor formed of the second semiconductor region, the third semiconductor region and the fifth or the sixth semiconductor region does not operate, and a latch-up can be prevented. Thus, it is possible to increase the controllable turn-off current.

DETAILED DESCRIPTION OF PREFERRED EMBODIMENTS

Embodiments of the present invention are explained below with reference to attached drawings.

Figure 1:
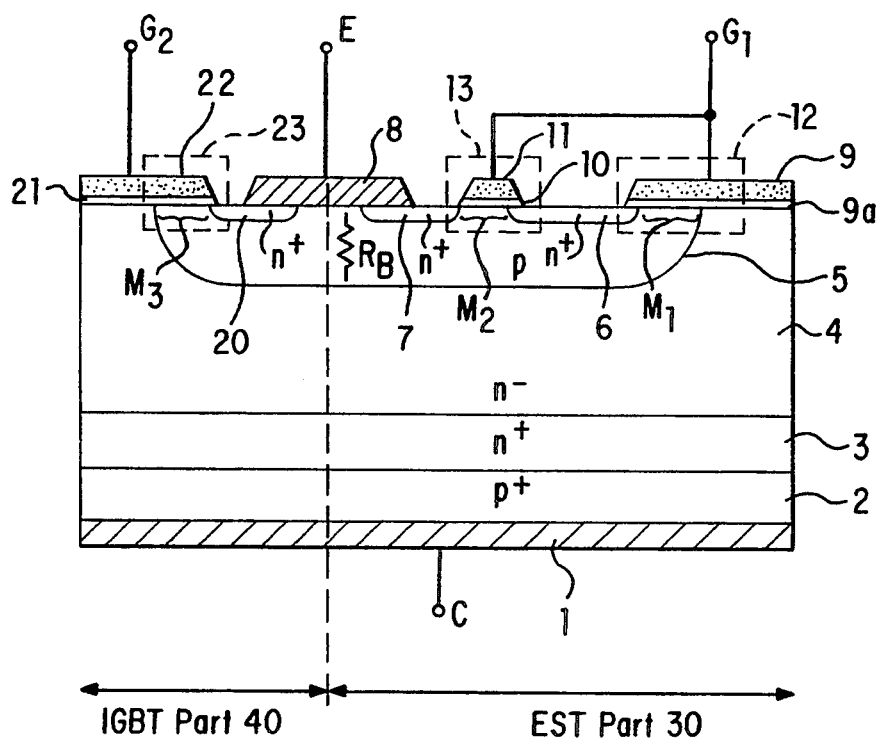
FIG. 1 is an explanatory cross section view showing a semiconductor device according to a first embodiment of the present invention.
Figure 2:
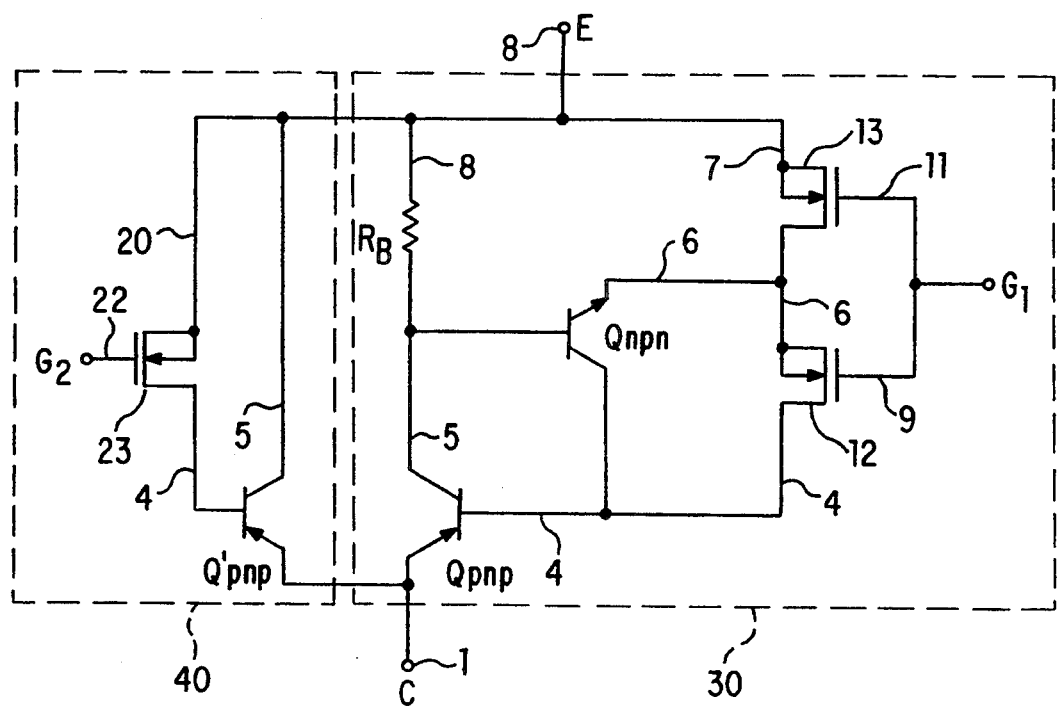
FIG. 2 is a circuit diagram showing the equivalent circuit of the semiconductor device of FIG. 1.

FIG. 1 is a cross section view showing a first embodiment of a semiconductor device according to the present invention. FIG. 2 is a circuit diagram showing an equivalent circuit of this semiconductor device.

The semiconductor device is formed of a collector (anode) layer 2 as a p+ type semiconductor substrate with which a collector electrode 1 (anode electrode of a thyristor) conductively contacts as a rear electrode; an n+ type buffer layer 3 formed on the collector layer 2; an n− type base layer 4 as a conductivity modulating layer (drift layer) formed on the buffer layer 3; a p type base region 5 formed in the form of a well in the main face side of the n− type base layer 4; an n+ type emitter region 6 (cathode region of the thyristor) formed in the p type base region 5 near one edge of the main face side; an n+ type source region 7 formed in the main face side of p type base region 5 to be isolated from the n+ type emitter region 6; an n+ type source region 20 formed in the main face side of the p type base region 5 at the other edge of the base region 5; an emitter electrode 8 (cathode electrode of the thyristor) which conductively contacts the p type base region 5 and extends to both the source region 7 and the source region 20; a first gate electrode 9 which uses one side of the p type base region 5 as a back gate (channel region) and is formed through a gate insulation film 9a to cover the n+ type emitter region 6 and the n− type base layer 4; a second gate electrode 11 which uses the p type base region 5 as a back gate (channel region) and is formed through a gate insulation film 10 to cover the n+ type source region 7 and the n+ type emitter region 6; and a third gate electrode 22 which uses another edge of the p type base region 5 as a back gate (channel region) and is formed through a gate insulation film 21 to cover the n+ type source region 20 and the n− type base layer 4.

The first gate electrode 9, the emitter region 6, a channel part M1 in the p type base region 5, and the n− type base layer 4 form a first MOSFET 12 for ON, and the second gate electrode 11, the source region 7 of n+ type, a channel part M2 in the p type base region 5 and the emitter region 6 form a second MOSFET 13 (emitter switch) for short-circuit. The third gate electrode 22, the source region 20, a channel part M3 in the p type base region 5 and the p type base regions 5 form a third MOSFET 23.

The first MOSFET 12, the second MOSFET 13 and the third MOSFET 23 are insulation gate field-effect transistors of n channel type, and the third MOSFET 23 can be independently switched from the first MOSFET 12 and the second MOSFET 13. Moreover, the p+ type collector layer 2, the n+ type buffer layer 3, the n− type base layer 4 and the p type base region 5 form a pnp type bipolar transistor $Q_{pnp}$, and the n− type base layer 4, the p type base region 5 and the n+ type emitter region 6 form an npn type bipolar transistor $Q_{npn}$. Besides, since the emitter electrode 8 conductively contacts the p type base region 5, there is a base resistance (diffused resistor) $R_B$ as a short circuit resistance in the base region 5.

Figure 9:
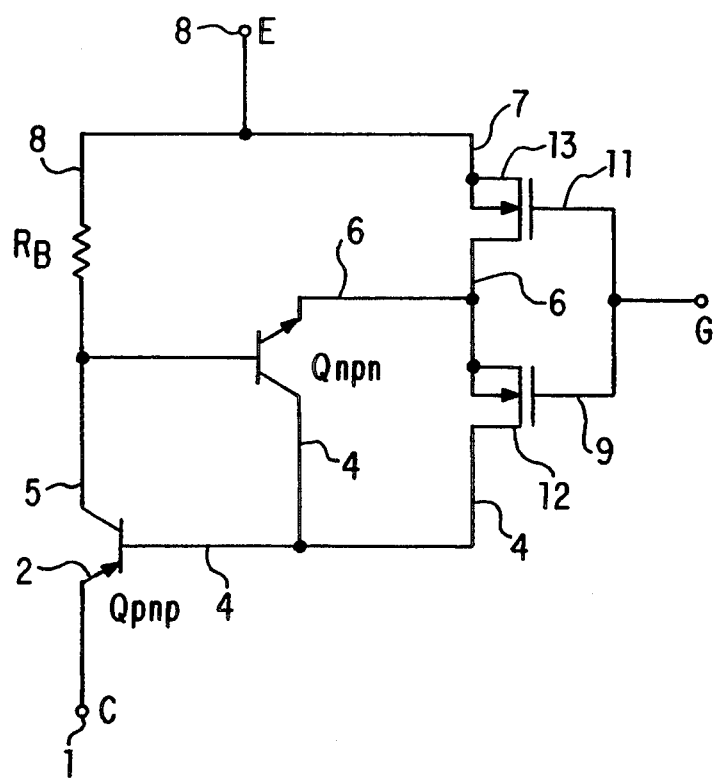
FIG. 9 is a circuit diagram showing the equivalent circuit of the EST shown in FIG. 8.
Figure 10A:
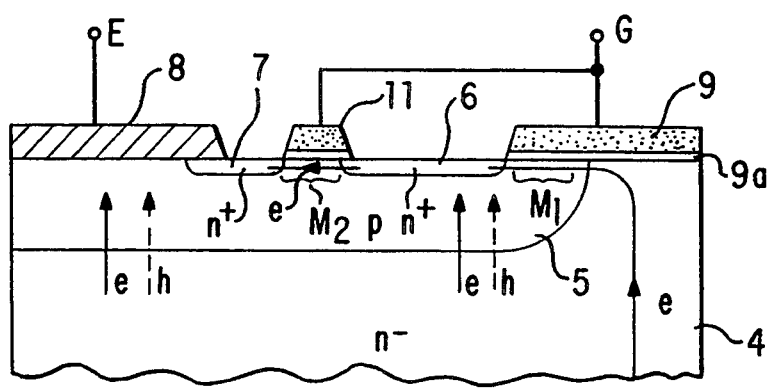
FIG. 10(a) is a cross section view showing the current flow at the thyristor state of the EST shown in FIG. 8.
Figure 10B:
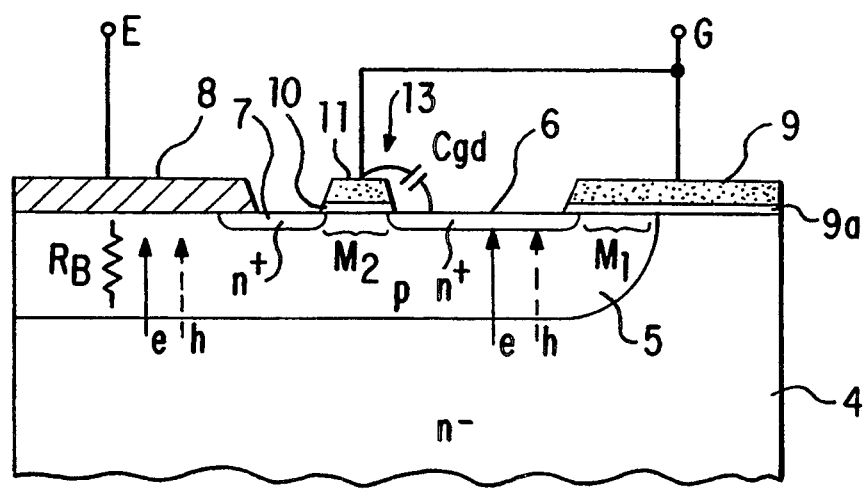
FIG. 10(b) is a cross section view showing the current flow of the initial turn-off state of the semiconductor of the same device.

An equivalent circuit of this semiconductor device has a circuit combining an equivalent circuit of a conventional EST shown in FIG. 9 and an equivalent circuit of IGBT (conductivity modulation type MOSFET, insulated gate bipolar transistor), as shown in FIG. 2. That is, the semiconductor device includes an IGBT part 40, and an EST part 30 which has a pnpn structure (thyristor structure) and is formed of the pnp type bipolar transistor $Q_{pnp}$ formed with the p+ type collector layer 2, the n+ type buffer layer 3, the n− type base layer 4 and the p type base region 5, and the npn type bipolar transistor $Q_{npn}$ which is formed of the n− type base layer 4, the p type base region 5 and the n+ type emitter region 6.

The EST part 30 has the transistors $Q_{pnp}$ and $Q_{npn}$, the first MOSFET 12 of n channel type to conduct and cut off between the n− type base layer 4 of the transistor $Q_{pnp}$ and the emitter region 6 of the transistor $Q_{npn}$, the second MOSFET 13 of n channel type to conduct and cut off between the emitter region 6 in the transistor $Q_{npn}$ the emitter electrode 8, and the short circuit resistance $R_B$ existing between the base region 5 of the transistor $Q_{npn}$ and the emitter electrode 8. Moreover, the IGBT part 40 has the pnp type bipolar transistor $Q'_{pnp}$ which is formed of the p+ type collector layer 2, the n+ type buffer layer 3, the n− type base layer 4 and the p type base region 5 and is arranged equivalently parallel to the transistor $Q'_{pnp}$, and the third MOSFET 23 of n channel type to conduct and cut off between the n− type base layer 4 of this transistor $Q'_{pnp}$ and the source region 20.

When high voltage is applied to the gate electrodes 9 and 11 and simultaneously to the gate electrode 22, an inversion layer is formed in the main face side of the p type base region 5 just under these electrodes, and then, the first MOSFET 12, the second MOSFET 13 and the third MOSFET 23 are turned on, wherein the majority carriers (electrons) are injected into the n− type base layer 4 through the emitter electrode 8, the source region 7, the channel part M2, the emitter region and the channel part M1, and also, the majority carriers (electrons) are injected into the n− type base layer 4 through the emitter electrode 8, the source region 20 and the channel part M3. Therefore, the conductivity of the n− type base layer 4 is modulated, the transistors $Q_{pnp}$ and $Q'_{pnp}$ formed of the collector layer 2, the buffer layer 3, the n− type base layer 4 and the p type base region 5 are turned on, and the transistor $Q_{npn}$ formed of the n$^{31}$ type base layer 4, the p type base region 5 and the n+ type emitter region 6 is turned on due to a voltage drop across the short circuit resistance $R_B$, so that the thyristor of pnpn structure is turned on.

Figure 3A:
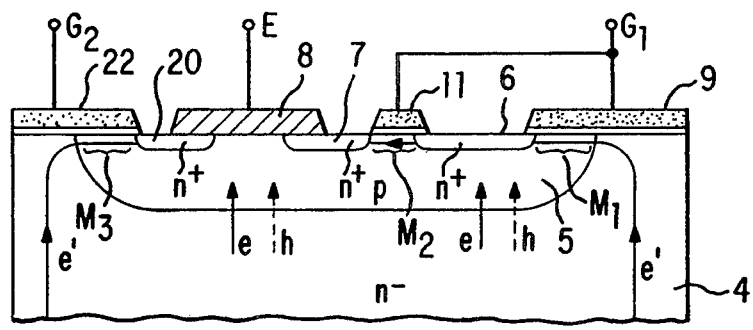
FIG. 3(a) is a cross section view showing the current flow at a thyristor state of the semiconductor device.

As this current path at turn-on, as shown in FIG. 3(a), there are electron currents e' (solid line arrow) through the first MOSFET 12 and the third MOSFET 23, electron currents e and positive hole currents h (dashed line arrow) through the junction of the p type base region 5 and the n+ type emitter region 6, and electron currents e and positive hole currents h through the short circuit resistance $R_B$ of the p type base region 5.

Figure 3B:
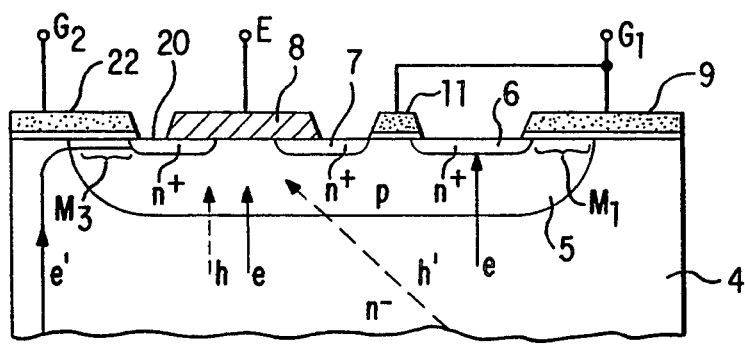
FIG. 3(b) is a cross section view showing the current flow in the state of the IGBT operation of the semiconductor device.

Next, in the turn-off operation of this device, the gate electrode 22 is at first kept at high voltage, and if zero or negative voltage is applied to the gate electrodes 9 and 11, the first and second MOSFETs 12 and 13 are turned off because the inversion layer of the p type base region 5 just under the gate electrodes 9 and 11 disappears. However, the third MOSFET 23 is kept at the on-state, so that this device changes into the IGBT operation mode. At the beginning of this turn-off period, since the third MOSFET 23 is kept at the on-state and the electron currents e' (solid line arrow) are kept flowing through the channel part M3 as shown in FIG. 3(b), the positive hole current h' (dashed line arrow) tending to flow toward the junction of the p type base region 5 and the n+ type emitter region 6 flows toward the emitter electrode 8, so that the current path is changed. Thus, the amount of the positive holes to be accumulated in the emitter region 6 decreases by the time that the potential barrier with the junction recovers.

In other words, in order to decrease the inflow of the positive holes to the emitter region 6 at the turn-off operation, the electron currents are kept flowing through the channel part M3, and the path of the main positive hole current is changed. Since the rise of the gate electric potential by the charge accumulation to the coupling capacity of the gate electrode 11 can be restrained, repetition of ON of the MOSFET 13 and the gate insulation film breakdown can be prevented. Also, the controllable turn-off current can be enlarged. Incidentally, after the potential barrier is recovered, zero or negative voltage is applied to the gate electrode 22 to thereby stop the transistor operation mode. Then, the turn-off is completed.

By the way, though the IGBT part 40 is shown to be formed of the electronic elements of the third MOSFET 23 and the transistor $Q'_{pnp}$ in the equivalent circuit in FIG. 2, an actual equivalent circuit may be different from the equivalent circuit of FIG. 2 due to the concentration and formation range of the semiconductor region and the operation mode. When changing to the IGBT operation mode, even if the electron current flowing through the first and second MOSFETs 12 and 13 stops, the electron current still continuously flows through the channel M3 of MOSFET 23. Thus, the positive hole current which flew up to that moment toward the junction of the p type base region 5 and the n+ type emitter region 6 flows through the path toward the emitter electrode 8. This exhibits the effect of recovering the barrier at the early stage by rapidly decreasing the amount of the positive holes accumulated in the emitter region 6 as mentioned above, but on the contrary, the current flowing through a portion near the junctions of the source regions 7, 20 increase.

Figure 4:
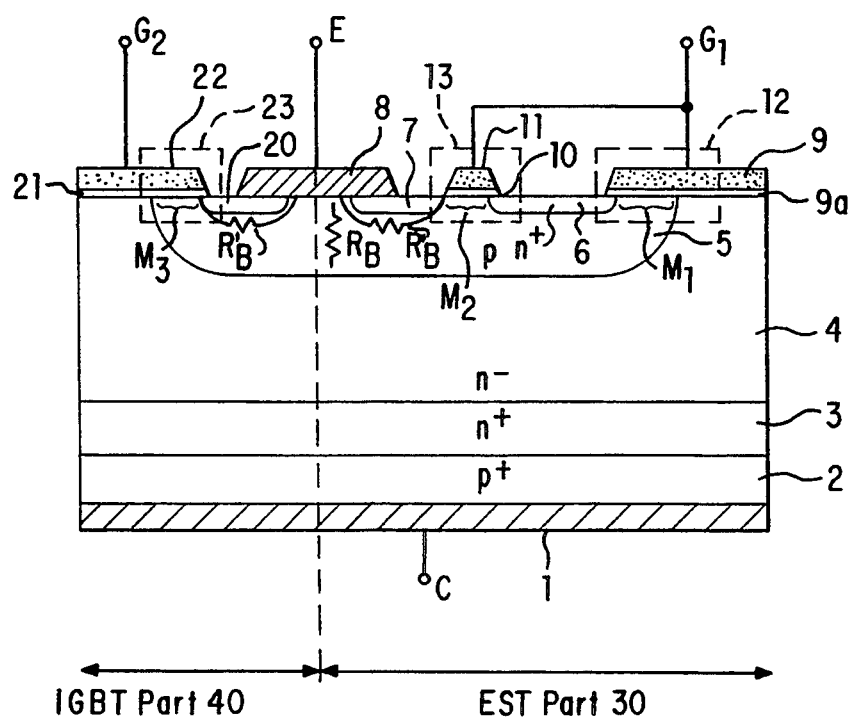
FIG. 4 is a cross section view showing a parasitic resistance in the first embodiment of the semiconductor device.
Figure 5:
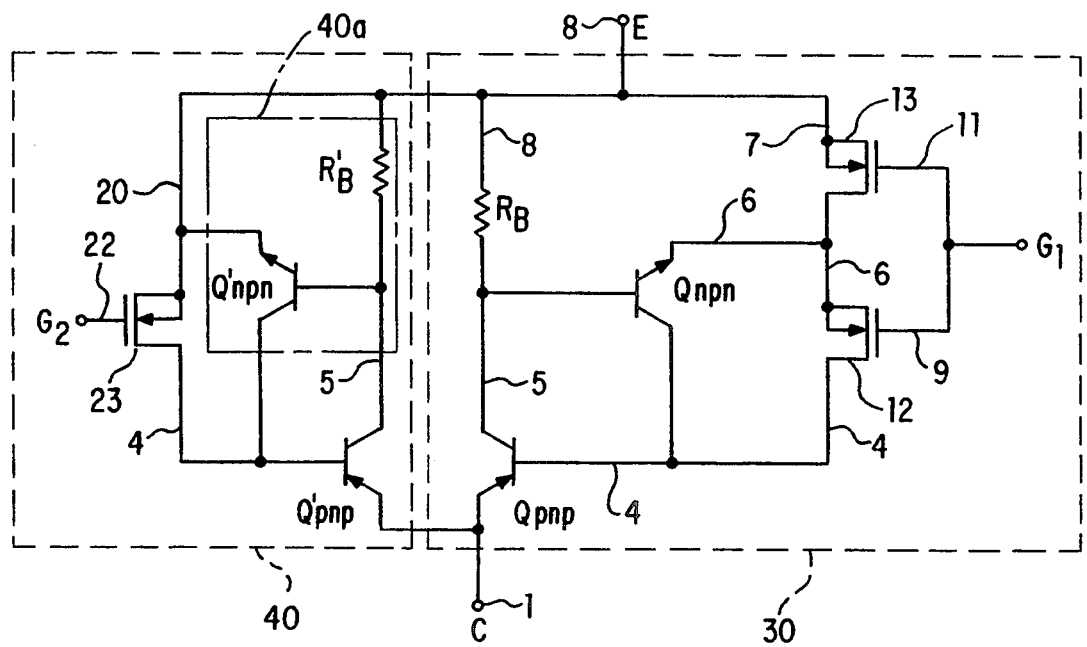
FIG. 5 is a circuit diagram of an equivalent circuit showing parasitic resistances and parasitic transistors of the first embodiment of the semiconductor device.

Short circuit resistances $R'_B$ (parasitic resistances) exist in a portion near the junctions of the source regions 7, 20, as shown in FIG. 4. If the increased current flows through these short circuit resistances $R'_B$, the p-n junctions of the p type base region 5 to the n+ type source regions 7, 20 are forward biased by their voltage drops, whereby a parasitic transistor $Q'_{npn}$ formed of the n+ type source regions 7, 20, the base region 5 and the n− type base layer 4, as shown in FIG. 5 operates. Thus, the IGBT part 40 may be latched up at the turn-off of the thyristor. Even if the MOSFET 23 is turned off, the IGBT part 40 will not turn off when this latch up occurs.

As mentioned above, in the structure where the EST part 30 and the IGBT part 40 coexist, since a parasitic element 40a in the IGBT 40 is not ignored, the new problem of latch-up at the turn-off occurs. Thus, the controllable turn-off current (current handling capability) can not be enlarged.

Figure 6:
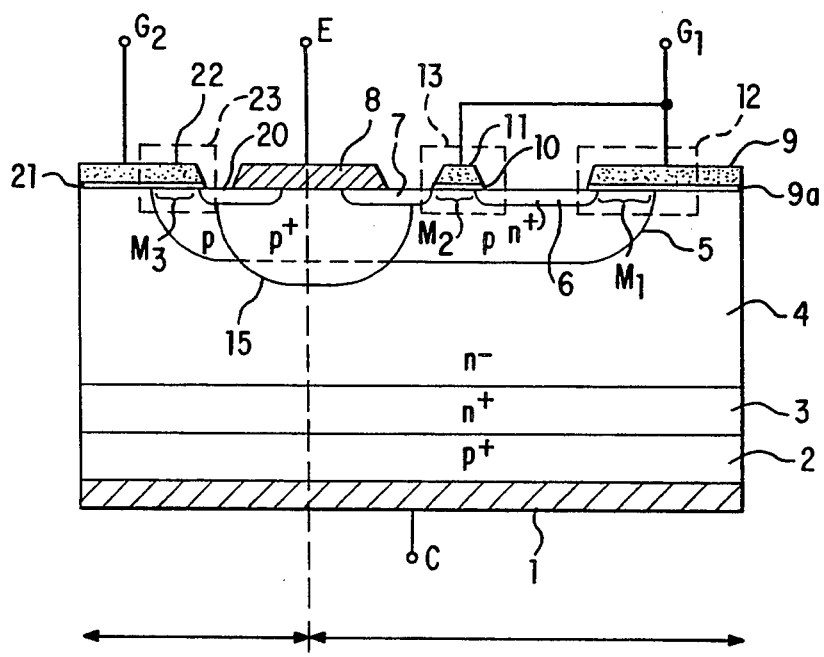
FIG. 6 is a cross section view showing a semiconductor device according to a second embodiment of the present invention.

FIG. 6 is a cross section showing a second embodiment of the semiconductor device according to the present invention. The semiconductor according to the second embodiment of the present invention is to solve the above-mentioned new problem, wherein an p+ type well 15 is formed at the region including the junctions of the source regions 7, 20 and the base region 5. This well 15 is highly doped and is deeply formed.

For instance, the p type base region 5 is set here at the impurity concentration of $1 \times 10^{16}$ to $5 \times 10^{17}$ cm$^{31\,3}$, and the depth of 2 to 20 micro meter, while the p+ type well 15 is set at the impurity concentration of $1 \times 10^{17}$ to $5 \times 10^{19}$ cm$^{-3}$ and the depth of 2 to 20 micro meter. Of course, the depth of the well 15 may be about the same or greater than that of the base region 5. The lateral extent at the surface side of the highly doped well 15 is formed not to, cover the parts of the channel M2 and M3.

The structure of the deep p+ type well 15 exhibits an effect which is, so to speak, similar to the graft base structure of a bipolar transistor. That is, since the junctions of the n+ type source regions 7, 20 and the vicinity are highly doped, the short circuit resistance $R'_B$ in the parasitic element 40a shown in FIG. 5 is made to have low resistance. Therefore, even if increased current flows instantaneously through the junctions and the vicinity at the time of the thyristor turn-off, the voltage drop does not become large. Thus the junctions are not forward biased, and the parasitic transistor $Q'_{npn}$ does not operate. It is possible to prevent latch-up, and to enlarge the controllable current.

Figure 7:
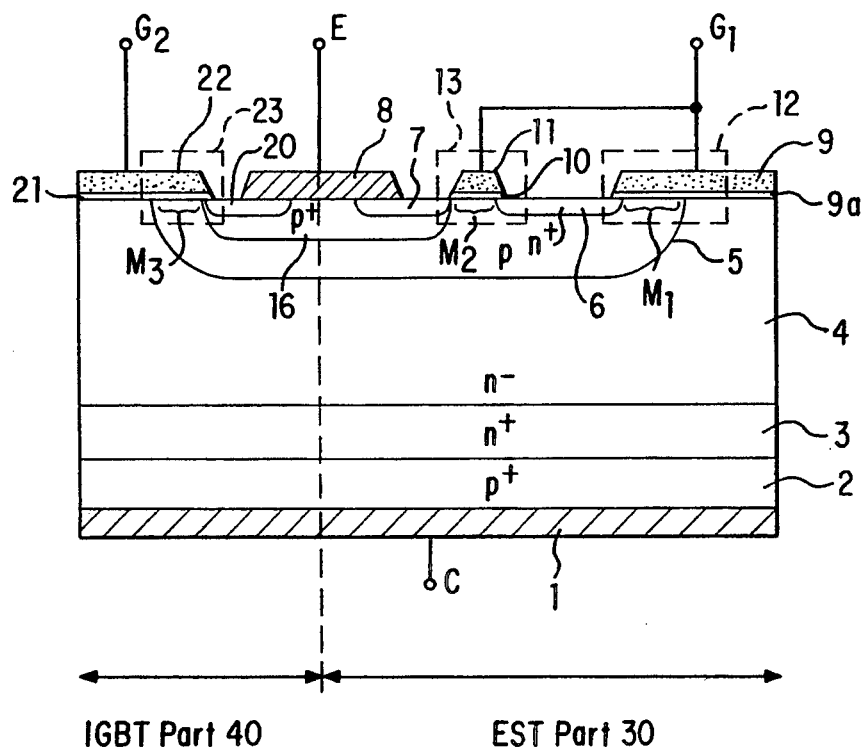
FIG. 7 is a cross section view showing a semiconductor device according to a third embodiment of the present invention.
Figure 8:
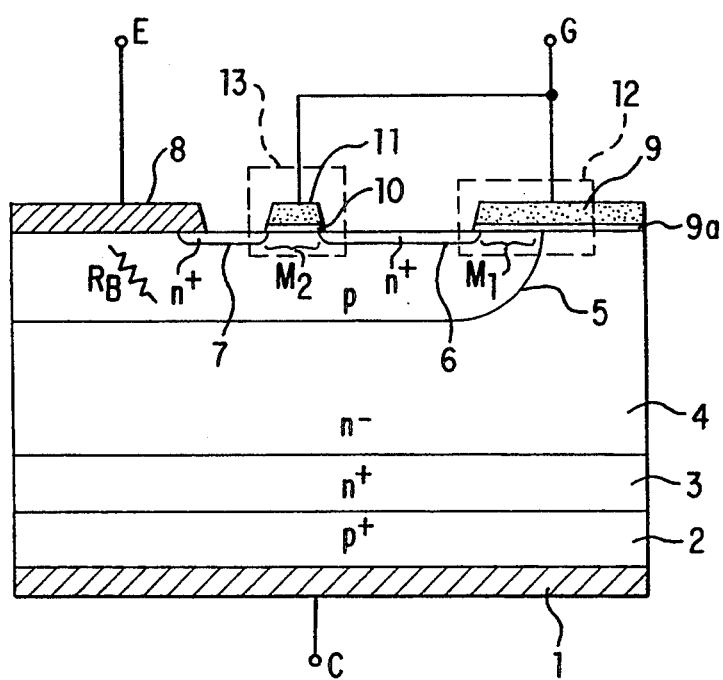
FIG. 8 is a cross section view showing one example of a conventional EST.

FIG. 7 is a cross section showing a third embodiment of the semiconductor device of the present invention. The semiconductor of the third embodiment is also to solve the above-mentioned new problem. However, the third embodiment differs from the second embodiment, and a highly doped p+ type well 16 which is shallower than the p type base region 5 is formed.

The p+ type well 16 is formed in the base region. 5, wherein the junctions of the p type base region 5 to the source regions 7, 20 and their vicinity are included. For instance, the p type base region 5 is set here at the impurity concentration of $1 \times 10^{16}$ to $5 \times 10^{17}$ cm$^{-3}$ and the depth of 2 to 20 micro meter, while the p+ type well 16 is set at the impurity concentration of $1 \times 10^{18}$ to $5 \times 10^{20}$ cm$^{-3}$ and the depth of 0.5 to 2 micro meter.

As the well 15 in the second embodiment is formed deep with high impurity concentration, the high impurity concentration may be insufficient. Moreover, it is difficult to make the sloped boundary close to the channels M2 and M3, because the concentration changes at the boundary of the well 15 and the base region 5. However, in the shallow p+ type well 16, it is possible to make the sloped boundary of the different concentration close to the channels M2 and M3 by the photo process, and to provide high impurity concentration easily in the third embodiment.

That is, it is possible to make the short circuit resistance $R'_B$ low compared with the structure of the second embodiment. The prevention of the latch-up at the turn-off can be securely achieved also in this embodiment, and the controllable turn-off current can be made large. Besides, it is possible to use both structures of the p+ type well 15 in the second embodiment and the p+ type well 16 in the third embodiment.

As explained above, in the EST structure with the first and second conventional MOSFETs, the present invention has the features that an IGBT part is formed to provide the third independently controllable MOSFET. Therefore, the following effects are obtained.

(1) Although the first and second MOSFETs are turned off at the initial stage of the turn-off operation, the third MOSFET is kept at turn-on stage, whereby only the IGBT operation is remained. Because the flow path of the carriers flowing into the fourth semiconductor region can be changed by the turn-off of the second MOSFET, the quantity of the charges accumulated in the fourth semiconductor region can be restrained, even if there is a recovery lag of the potential barrier with the p-n junction in the fourth semiconductor region. Therefore, repetition of ON of the second MOSFET and the gate insulation film breakdown can be prevented, whereby controllable turn-off current can be enlarged under a low on-state voltage.

In other words, since repetition of ON can be restrained, the turn-off time can be shortened.

(2) If a high concentration semiconductor region of the first conduction type is formed at the junction and the vicinity of the fifth semiconductor region and the sixth semiconductor region of the second conduction type, a parasitic resistance (short circuit resistance) at the junction and the vicinity is made to have low resistance. Therefore, even if the increasing current flows at the turn-off stage through the junction and the vicinity, the voltage drop across the short circuit resistance is not increased. Thus, a parasitic bipolar transistor formed of the second semiconductor region, the third semiconductor region and the fifth or sixth semiconductor region does not operate. Accordingly, latch-up can be prevented, and the controllable turn-off current can be securely enlarged.

While the invention has been explained with reference to the specific embodiments of the invention, the explanation is illustrative and the invention is limited only by the appended claims.

What is claimed is:

1. A semiconductor device comprising,
   a thyristor structure formed of a first semiconductor region of a first conduction type, a second semiconductor region of a second conduction type, a third semiconductor region of the first conduction type, and a fourth semiconductor region of the second conduction type formed in a main face side of said third semiconductor region,
   a fifth semiconductor region of the second conduction type formed in a part of the third semiconductor region, said fifth semiconductor region being isolated and independent from said fourth semiconductor region,
   a first MOSFET including said third semiconductor region as a back gate, said first MOSFET injecting majority carriers from said fourth semiconductor region to said second semiconductor region,
   a second MOSFET including said third semiconductor region as a back gate, said second MOSFET being switched to synchronize with said first MOSFET and conducting and cutting off said fourth semiconductor region and said fifth semiconductor region,
   an electrode conductively contacting said third semiconductor region and said fifth semiconductor region,
   a sixth semiconductor region of the second conduction type, said sixth semiconductor region being formed in the main face side of the third semiconductor region to be isolated from said fifth semiconductor region, and conductively contacting said electrode, and
   a third MOSFET including said third semiconductor region as a back gate, said third MOSFET injecting majority carriers from said sixth semiconductor region to said second semiconductor region and being switchable independently from said first MOSFET.

2. The semiconductor device as claimed in claim 1, further comprising a highly doped semiconductor region of the first conduction type formed in said third semiconductor region of the first conduction type and disposed at at least a vicinity of junctions of said third semiconductor region to said fifth semiconductor region of the second type and to said sixth semiconductor region of the second type.

3. The semiconductor device as claimed in claim 2, wherein said highly doped semiconductor region of the first conduction type is a well region, the depth of the well region being at least equal to that of said third semiconductor region of the first conduction type.

4. The semiconductor device as claimed in claim 2, wherein said highly doped semiconductor region of the first conduction type is a well region, the depth of the well region being shallower than that of said third semiconductor region of the first conduction type.

5. The semiconductor device as claimed in claim 2, wherein said highly doped semiconductor region of the first conduction type is a well region, the depth of the well region being deeper than that of said third semiconductor region of the first conduction type.

6. The semiconductor device as claimed in claim 1, wherein said semiconductor device includes an EST part and an IGBT part as one unit.

7. The semiconductor device as claimed in claim 6, wherein the EST part has the first MOSFET and the second MOSFET synchronously switching, and the IGBT part has the third MOSFET controllable independently from the EST part.

8. The semiconductor device as claimed in claim 1, wherein said first, second and third MOSFETs form insulation gate type filed-effect transistors.

* * * * *